United States Statutory Invention Registration [19]

[11] Reg. Number: H718

Hester

[43] Published: Dec. 5, 1989

[54] MULTI-SENSOR BUFFER INTERFACE

[75] Inventor: Troy L. Hester, Huntsville, Ala.

[73] Assignee: The United States of America as represented by the Secretary of the Army, Washington, D.C.

[21] Appl. No.: 287,741

[22] Filed: Dec. 19, 1988

[51] Int. Cl.[4] ..... H03K 21/08

[52] U.S. Cl. ..... 377/114; 377/118

*Primary Examiner*—Stephen C. Buczinski
*Assistant Examiner*—Linda J. Wallace
*Attorney, Agent, or Firm*—Freddie M. Bush; James T. Deaton

[57] ABSTRACT

A multi-sensor buffer interface that couples a multi-sensor inertial measurement unit to a missile flight computer. The buffer converts input serial data into 16 bit parallel data and outputs messages of either 6 or 16 words. The buffer will provide computer requested data until the computer changes state of the controlling input signal or until communication between the buffer and the computer fails.

2 Claims, 6 Drawing Sheets

A statutory invention registration is not a patent. It has the defensive attributes of a patent but does not have the enforceable attributes of a patent. No article or advertisement or the like may use the term patent, or any term suggestive of a patent, when referring to a statutory invention registration. For more specific information on the rights associated with a statutory invention registration see 35 U.S.C. 157.

MULTI-SENSOR BUFFER INTERFACE

DEDICATORY CLAUSE

The invention described herein may be manufactured, used, and licensed by or for the Government for governmental purposes without the payment to me of any royalties thereon.

BACKGROUND OF THE INVENTION

During flight of a missile from a launch site toward a target many sensors associated with the missile flight path or flight plan are constantly directing signals to control the guidance of the missile or indicate external conditions to the missile. Typical of these is a multiple sensor inertial measurement unit which provides data from many sensors in a serial format output generally referred to as a synchronous serial bitstream. Data formatted in this way cannot be properly processed in serial format by many flight computers which are designed to receive parallel format information. The multi-sensor buffer interface converts serial bit stream data into parallel format for use with parallel format computer systems.

SUMMARY OF THE INVENTION

The multi-sensor buffer interface (MBI or buffer) couples a multi-sensor inertial measurement unit to a missile flight computer. The MBI converts one megahertz (MHz) serial data to a 16-bit parallel data format. The inertial measurement unit has three output signals: ready to send (RTS), output ready (OR), and DATA. Inputs to the inertial measurement unit are: Data Clock (DCLK), and Flight-Ground Discreet (F/$\overline{G}$). The buffer outputs messages to the computer of either 6 or 16 words. The message length depends on the state of the MLF Discrete signal from the computer. At the beginning of a message transmission from the multi-sensor buffer to the computer, the RTS line goes high and remains high until the message is complete. When the data from the inertial measurement unit is valid, OR goes high and remains high until DCLK goes high. A new bit is transmitted after DCLK returns to low.

DESCRIPTION OF THE PREFERRED EMBODIMENT

Figure 1:
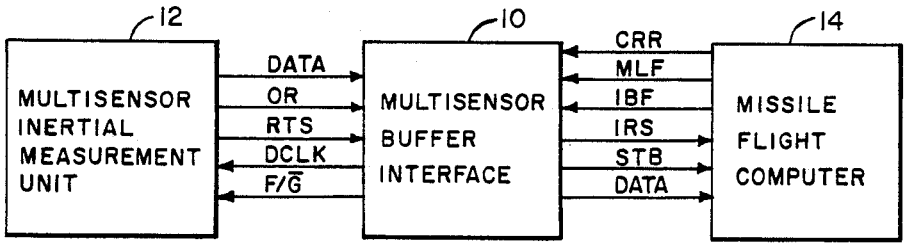
FIG. 1 is a simple block diagram of the multi-sensor buffer interface disposed between multi-sensor inertial measurement circuitry and a missile flight computer.

Referring now to the drawings wherein like numbers refer to like parts in the several figures and wherein extraneous routine circuitry is not shown, a multi-sensor buffer interface system is shown wherein a buffer is coupled between a missile flight computer and a multi-sensor inertial measurement system for converting serial data into parallel format. FIG. 1 of the drawings discloses the multi-sensor buffer interface 10, referred to hereinafter as the buffer, coupled between the multi-sensor inertial measurement unit (MIMU) 12 and a missile flight computer 14 for changing one megahertz serial data from the MIMU to a 16 bit parallel data format which is required by the flight computer. This circuitry is all disposed within a missile housing (not shown).

Figure 2:
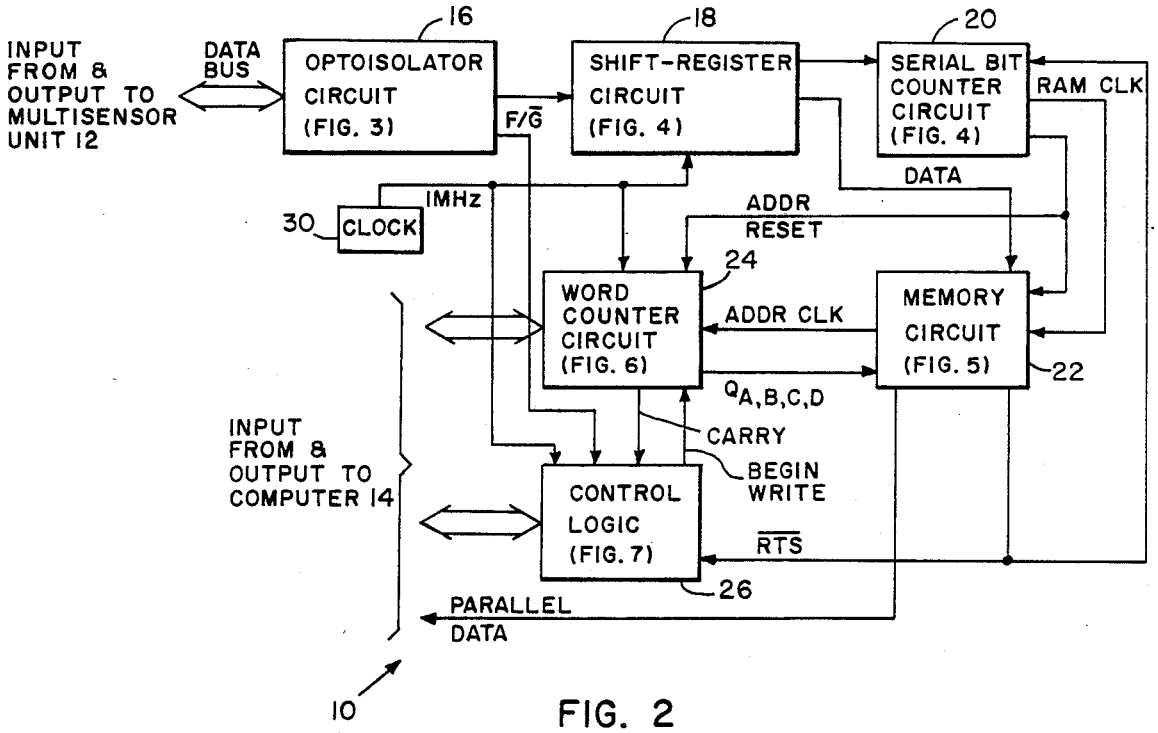
FIG. 2 is a block diagram of the circuitry internal to the multi-sensor buffer interface for coupling between the multi-sensor inertial measurement circuitry and the missile flight computer.

FIG. 2 discloses buffer 10 in more detail and discloses the buffer to comprise an optoisolator circuit 16, shift register circuitry 18, serial bit counter circuitry 20, a memory circuit 22, a word counter circuit 24, and control logic circuitry 26. A clock 30 is used by the various circuits to provide synchronization. Typical clock distribution is shown partially. Power distribution, the remaining clock signals and other routine circuitry well established in the art are not shown.

Figure 3:
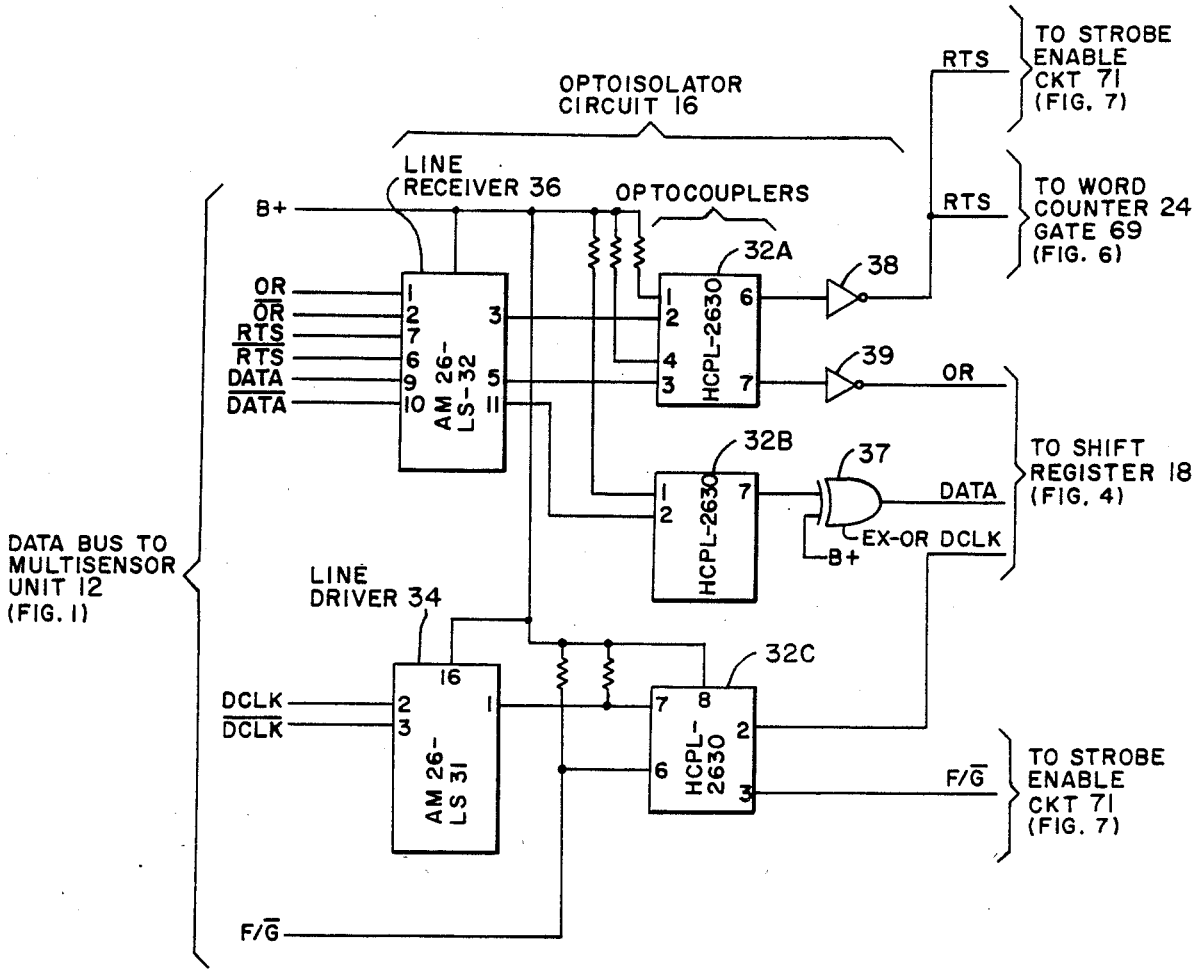
FIG. 3 is an optoisolator circuit.

Optoisolator circuit 16 provides isolation between the multi-sensor inertial measurement unit and the shift register circuitry and is shown in detail in FIG. 3 of the drawings. The optoisolators provide optical isolation from the multi-sensor inertial measurement unit using optocouplers 32A, 32B and 32C. Optocouplers 32A and 32B isolate incoming signals DATA, OR and RTS. Optocoupler 32C isolates the return signal DCLK. Signals to and from the multisensor inertial measurement unit 12 are driven and received by a line driver 34 and a line receiver 36. The output signal from optocoupler 32B is coupled through an exclusive OR gate 37 to provide the DATA output signal from the optoisolator circuit. Invertors 38 and 39 couple the respective RTS and OR outputs from optocoupler 32A. The DCLK output signal and the F/$\overline{G}$ signal are coupled from optocoupler 32C. The signals OR, RTS, DATA and DCLK are coupled to shift register circuit 18. The F/$\overline{G}$ output from optocoupler 32C is also coupled to control logic circuit 26. Additional RTS outputs are coupled to word counter 24 and the strobe enable circuit of control logic circuit 26.

Figure 4:
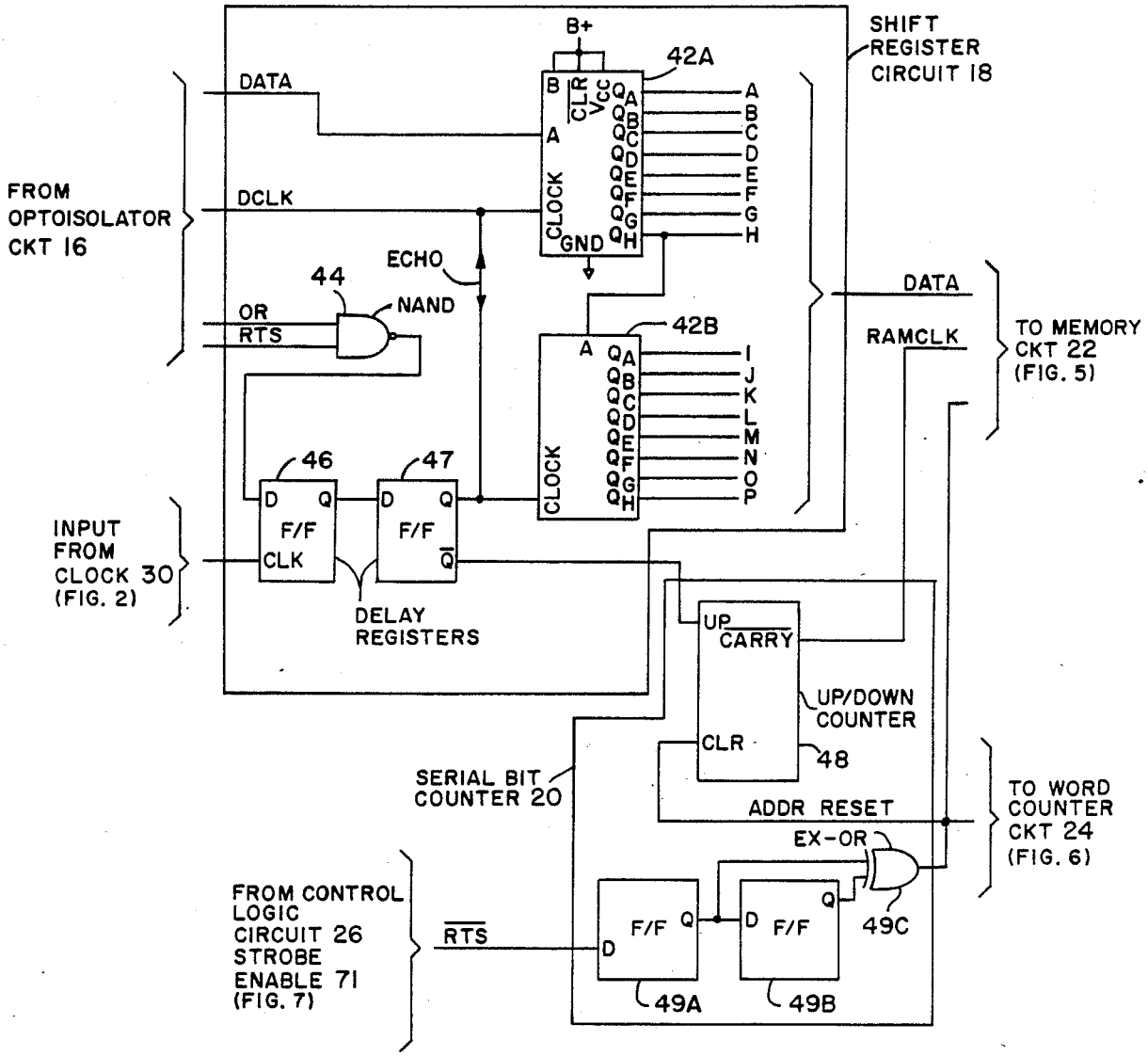
FIG. 4 is the shift register and serial bit counter circuit for the system.

Shift register circuitry 18 has inputs from the optoisolator circuit 16 as noted hereinabove. The shift register circuitry is shown in more detail in FIG. 4. Basic serial -to-parallel conversion is performed with two parallel output shift registers 42A and 42B. These two 8-bit shift registers are cascaded to accommodate the 16 bit word. The shift registers are clocked by a positive going transition of DCLK which is coupled as an input from the multi-sensors inertial measurement unit via the optoisolator circuitry. The DATA input from the optoisolator was in serial format but is now coupled out in parallel format from shift registers 42A and 42B directly to memory circuit 22 as shown in FIG. 2 and in FIG. 5 in more detail. The OR and RTS input signals from the optoisolator circuitry to the shift register circuit 18 are coupled into a NAND gate 44 and control operation of a flip-flop 46 that functions as a delay register in conjunction with a second flip-flop delay register 47. The Q output of delay register 47 is coupled as the clock input to shift registers 42A and 42B and provides an echo signal back to the MIMU through the optoisolator circuitry on the DCLK signal path. The NOT Q output of the delay register 47 is coupled as an input to a counter 48 of the serial bit counter circuit 20. Up/down counter 48 receives the NOT Q output from delay register 47 and provides a NOT CARRY output (RAMCLK) which is coupled directly to the memory circuit shown in FIG. 5. Additionally, serial bit counter circuit 20 includes a pair of flip-flops 49A and 49B coupled in series and each having an output coupled to an exclusive OR gate 49C, An input to flop-flop 49A is coupled from the control logic circuit 26 as the NOT RTS signal. The output from OR gate 49C is coupled to provide an ADDR Reset signal input to counter 48, to the memory circuit 22, and to word counter circuit 24.

Figure 5:
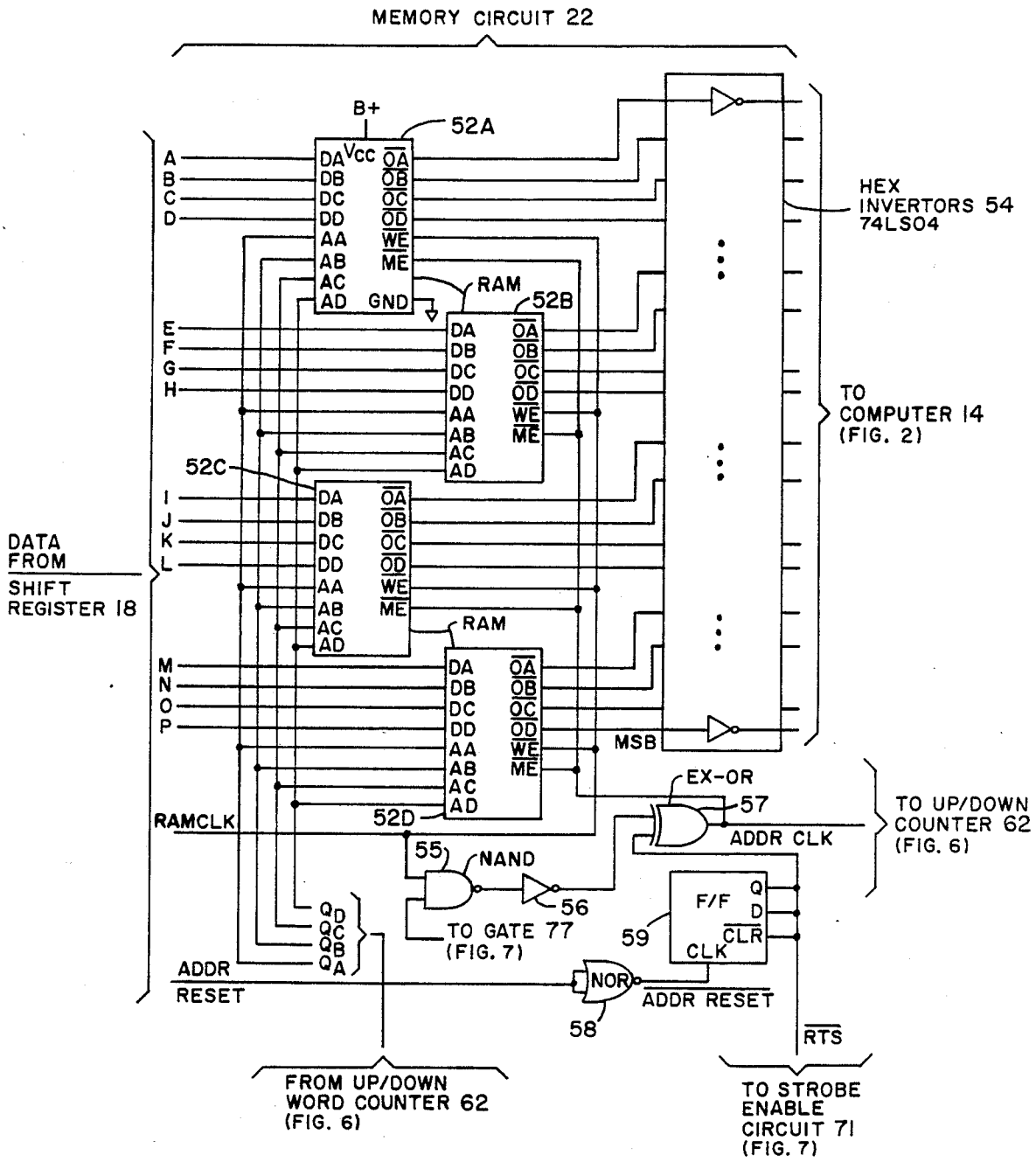
FIG. 5 is the memory circuit.

Memory circuit 22, shown in FIGS. 2 and 5, is comprised primarily of four random access memory circuits which are 64-bit tri-state RAM's 52A, 52B, 52C, and 52D. These RAMS (random access memories) are coupled to receive DATA input from the shift register circuits 42A and 42B of shift register 18. Outputs from the random access memories 52A–52D are coupled respectively through an array of hex invertors 54. Outputs from these invertors are coupled as the 16 bit parallel data coupled to computer 14. Within memory circuit 22 the RAMCLK input from serial bit counter circuit 20 is coupled to each RAM circuit 52A–52D and to a NAND gate circuit 55. NAND gate circuit 55 is coupled through an invertor 56 to an exclusive OR gate 57 for providing an output signal to the RAM circuits and for providing an ADDR CLK signal to the word counter circuitry shown in more detail in FIG. 6.

Figure 6:
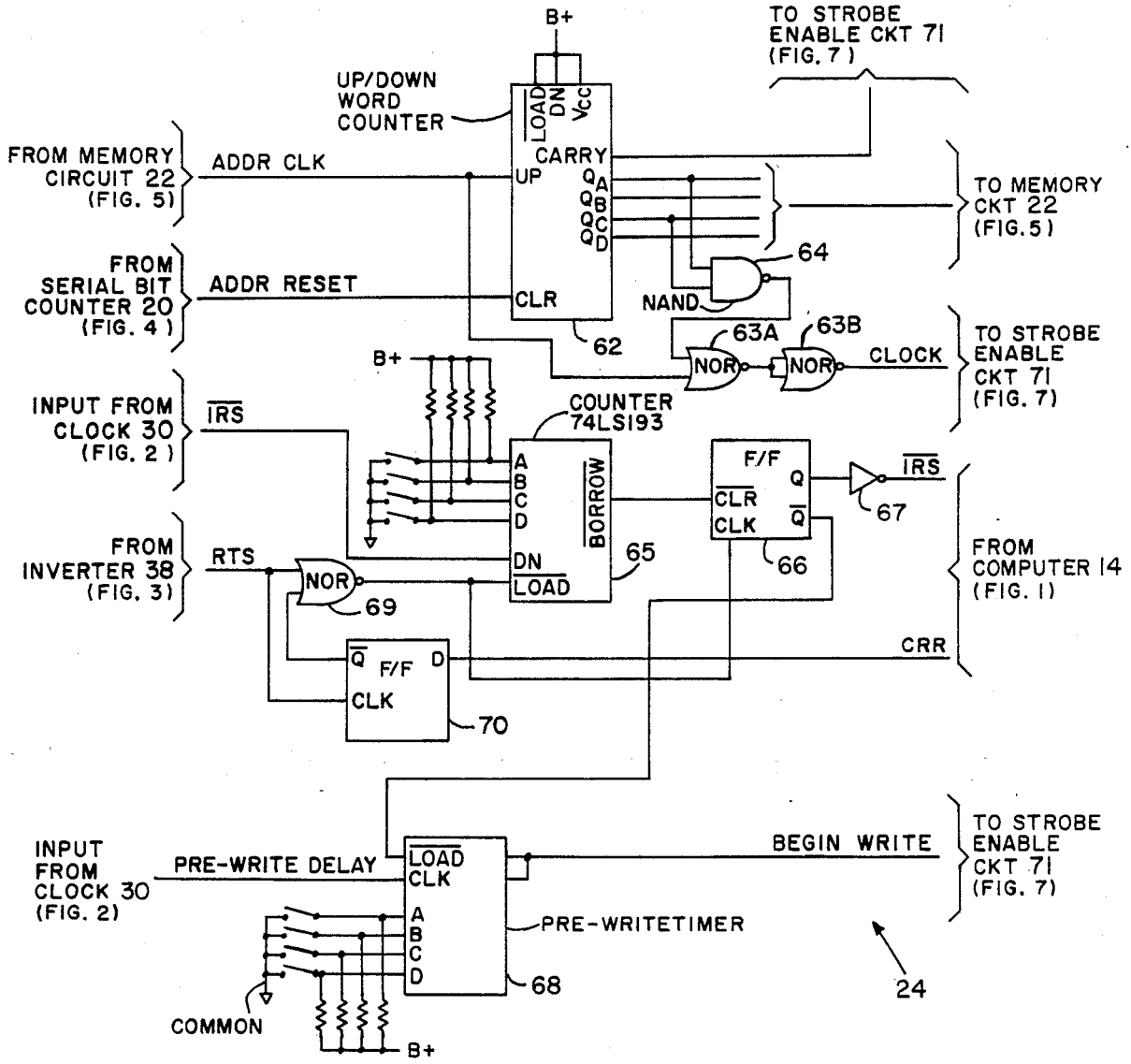
FIG. 6 is the word counter circuitry.

As shown in FIG. 6, outputs from word counter circuit 24 are coupled from an up/down counter 62 to each of RAM circuits 52A–52D in memory circuit 22. The ADDR Reset output from OR gate 49C of serial bit counter circuit 20 (FIG. 4) is coupled as shown in FIGS. 5 and 6 as inputs to a NOR gate 58 for resetting dual flip flop 59 and for providing the clear input to word counter 62.

In addition to receiving inputs from counter circuit 20 and memory circuit 22 and outputing signals to memory circuit 22 as noted hereinabove, word counter circuit 24 receives a Begin Write signal from the control logic circuit 26. Word counter circuit 24 and shift register circuit 18 also receive clock inputs signals from clock 30 at a one Megahertz rate. The synchronizing clock inputs are coupled directly or indirectly to other circuits within the system, but this routine circuitry is not shown in further detail.

Figure 7:
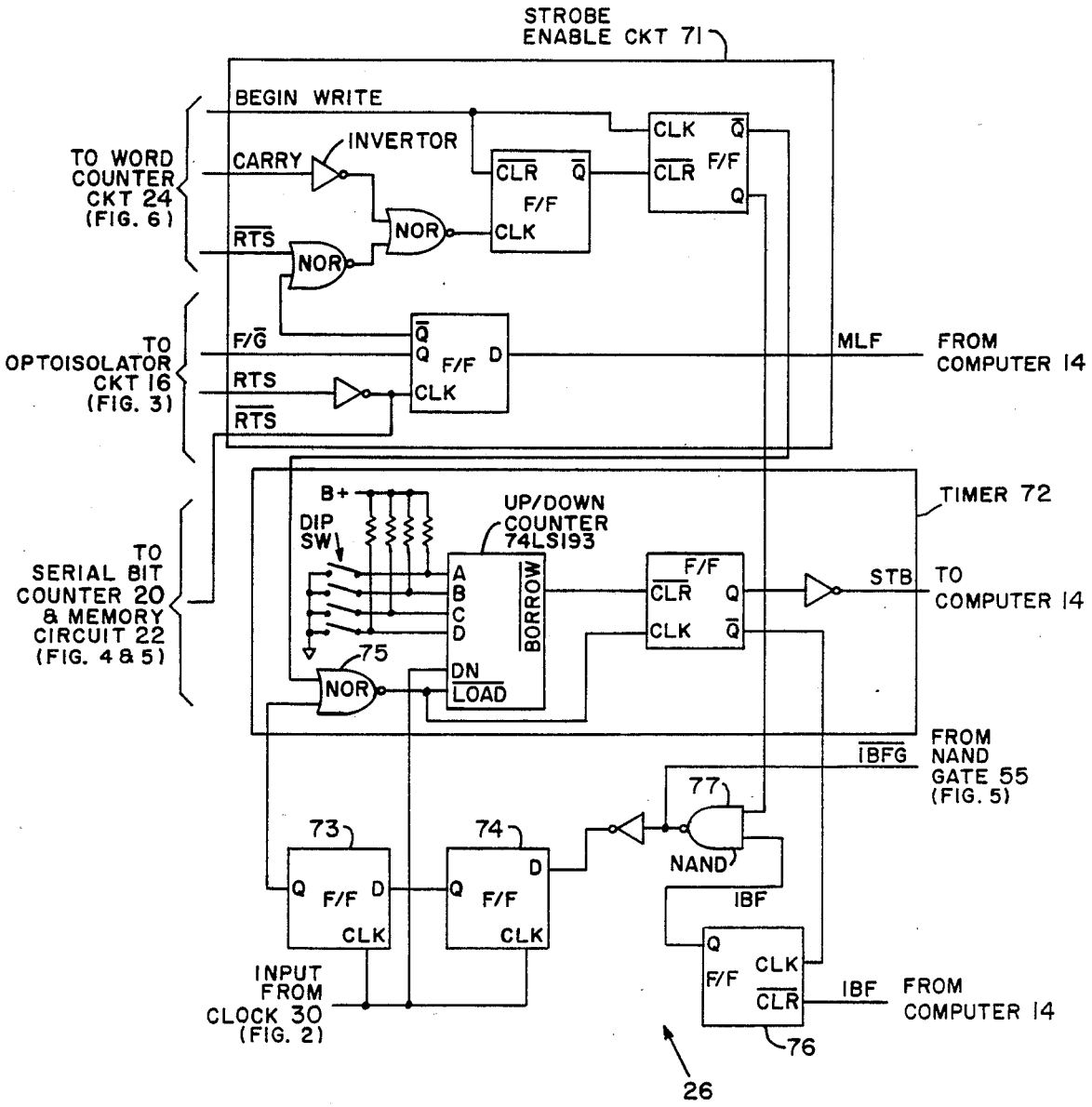
FIG. 7 is the control logic circuitry.

In addition to up/down counter 62, the word counter 24 comprises a pair of NOR gates 63A and 63B coupled in series. An input is coupled between the UP input of up/down counter 62 and one input to NOR gate 63A. A NAND gate 64 has inputs coupled respectively between the $Q_A$ and the $Q_C$ output of up/down counter 62 and has an output coupled to NOR gate 63A to provide a controlled operation of the NOR gates. The output from NOR gate 63B is coupled to strobe enable circuit 71 to inhibit the strobe output after a 6 word data transfer. A counter circuit 65 is coupled to provide an input to flip flop 66 for controlling the timed operation of the flip flop and together function as a timing circuit. Flip flop 66 has a Q output coupled through an invertor 67 to computer 14. The NOT Q terminal of flip flop 66 is coupled to the NOT Load terminal of a pre-write timer 68 (an up/down counter circuit) which also receives an input from clock 30 and a BEGIN WRITE signal from control logic circuit 26. A NOR gate 69 receives a negative going RTS signal from invertor 38 of FIG. 3 and a NOT Q input from a flip flop 70 and provides an output that is coupled to the NOT LOAD input of timer 65 and to the clock input of flip flop 66. Flop flop 70 also receives a CRR (computer ready to receive) input from computer 14. As shown in FIG. 7 control logic circuit 26 comprises a strobe enable circuit 71 that provides the BEGIN WRITE output signal to prewrite timer 68 and receives a CARRY signal from up/-down word counter 62 (FIG. 6). Strobe enable circuit 71 also provides the NOT RTS output that is coupled to drive flip flop 49A of FIG. 4, OR gate 57, and flip flop 59 of FIG. 5. Control logic circuit 26 also includes a timer 72 that is coupled between strobe enable circuit 71 and computer 14 for providing a strobe or STB signal to the computer. In response to clock inputs at the one Megahertz rate a pair of flip flops 73 and 74, in conjunction with an output from strobe enable circuit 71 initiate operation of the timer through a NOR gate 75 within the timer circuit. A flip flop 76 receives an input (IBF) from computer 14 and has an output coupled to provide the IBF signal input to a NAND gate 77 in conjunction with an output from strobe enable 71 for driving the NAND gate. An output signal from NAND gate 77 is coupled through an invertor to the D input of flip flop 74 and is further coupled as the NOT IBFG input to NAND gate 55 as shown in FIG. 5.

Typically, missile flight computer may be an 8216 Processor board provided by the Intel company; and multisensor inertial measurement unit 12 may be a model 88818-K600A156-01 provided by the Singer-Kearfott company.

Specific circuit components of the multi-sensor buffer interface 10 are set forth in Table one. These components are identified by reference to the drawing number and a description of the typical available off the shelf items that can provide the function.

TABLE I

| Drawing No. s | Part No. | Description |
|---|---|---|
| 42A, 42B | 74LS164 | 8-bit parallel out-shift register |
| 46,47,49A,49B | 74LS175 | Quad D flip-flop register |
| 44,55,64,77 | 7400 | Quad NAND gate |
| 30 | 74LS221 | Dual monostable multivibrator (clock) |
| 48,62,65 | 74LS193 | Synchronous 4-bit binary Up/Dn counter |
| 37,49C,57 | 7486 | Quad 2-input EX-OR gate |
| 52A,52B,52C,52D | 74C89 | 64-bit TRI-STATE RAM |
| 38,39,54,56,67 | 74LS04 | Hex invertor |
| 59,66,70,76,73,74 | 74LS74 | Dual D flip-flop |
| 69,75,58,63A,63B | 7402 | Quad NOR gate |
| 68 | 74LS194 | Synchronous 4-bit Up/Dn counter |
| 32A,32B,32C | HCPL-2630 | Dual TTL compatible opto-coupler |
| 36 | AM26LS32 | RS422 quad-line receiver |
| 34 | AM26LS31 | RS422 quad-line driver |

Initiation of data transfer from the multi-sensor buffer interface to the computer begins with the computer setting the level of the message length request control line (MFL) to indicate the desired message length and then setting the level of the computer ready to receive (CRR) control line to indicate that the computer is ready to receive data. The multi-sensor buffer interface responds by outputing DATA words in the requested message length format (MSB and LSB) to the computer. This data transfer is accomplished in normal signal line "handshaking" manner. Messages will continue to be output by the buffer interface in the requested format until either:

the state of the message length request control line changes, after which the buffer interface will output data messages in the newly requested format, or the state of the computer ready to receive control line changes to indicate that the computer is no longer ready to receive data, after which the buffer interface will cease data transmission after completing any current message in progress, or communications between the multi-sensor itself and the buffer interface fail, after which the buffer interface will complete the output of any message already in progress before ceasing data transmission.

Logic conventions for both outgoing and incoming lines at the computer's input port follow so-called Positive Logic, i.e., "TRUE" (logical One)="HIGH" level;

,

"FALSE" (logical Zero) ="LOW" level.

Computer Ready to Receive Control Line

With reference to FIGS. 1 and 6, when the computer is ready to receive data from the multi-sensor buffer interface, it will set the computer ready to receive control line (CRR) to the "TRUE" state. This line will be set to the "FALSE" state when the computer is initialized at power on and at any subsequent time that data input from the multisensor buffer interface is not desired.

Message Length Request Control Line (MLF)

This line is set to the "LOW" level by the computer to indicate that a long data message is desired, and it is set to the "HIGH" level to indicate that a short message is desired. The line is set to the "LOW" level when the computer is initialized at power on. The condition of this line is passed through the multi-sensor buffer interface to the multi-sensor itself, where it acts as the Flight/Ground discrete F/$\overline{G}$) to control the number of words output during each subsequent Ready To Send (RTS) data transfer cycle from inertial measurement unit 12.

Strobe Line

Strobe or STB is a routine signal output by the buffer to initiate a parallel word transfer to the flight computer.

Interface Ready to Send Control Line

This IRS control line serves as the synchronization signal between the buffer interface and the computer. When the buffer interface is ready to send a message of data words to the computer, it will pulse its Interface Ready to Send (IRS) line from "HIGH" to "LOW" to "HIGH" and then commence outputing the message.

Data Words

Any message in progress of transmission when a change in state is detected will be completed. The multi-sensor buffer interface will respond to the message length request and computer ready to receive control signals by sending the data received from the multi-sensor according to the following schedule.

(a) For computer ready to receive signal ="FALSE", no new message will be output until after this signal has been set ="TRUE".

(b) For computer ready to receive signal ="TRUE" and message length request signal ="LOW" level, the messages output subsequently will consist of data words one through sixteen.

(c) For computer ready to receive signal ="TRUE" and message length request signal ="HIGH" level, the messages output subsequently will consist of the data words in the multi-sensor short message format.

Although the present invention has been described with reference to a preferred embodiment, workers skilled in the art will recognize that changes may be made in the form and detail without departing from the scope and spirit of forgoing disclosure. Accordingly, the scope of the invention should be limited only the claims appended hereto.

I claim:

1. In a data transfer system, wherein data arranged in serial format must be processed in parallel data format, a buffer interface for converting the data from serial to parallel format comprising: a shift register circuit for receiving data in serial format and outputing data in parallel format, a serial bit counter circuit a random access memory circuit, a clock coupled to said shift register circuit for providing synchronization signals thereto, said serial bit counter circuit being disposed in series between said shift register circuit and said memory circuit for clocking the memory circuit in response to clock synchronization signal inputs from said shift register circuit, said parallel data output of said shift register circuit being coupled directly to said memory circuit, said memory circuit having plural outputs disposed for coupling data in parallel format to using circuitry.

2. In a data transfer system, wherein data arranged in serial format must be processed in parallel data format, a buffer interface as set forth in claim 1 and further comprising word counting means and a control logic circuit, said word counting means having outputs coupled to said memory circuit and having inputs from said memory circuit and said serial bit counter for respectively clocking and resetting the word counting means; said control logic circuit having first and second inputs and an output, said first input being coupled to receive an output from said memory circuit, said second input being coupled to receive an output from said word counting means to initiate a begin write output signal on said output, said output being coupled to the word counting means for controlling when the control outputs coupled to said memory circuit are activated.

* * * * *